(12) United States Patent
Katayama et al.

(10) Patent No.: US 10,442,729 B2
(45) Date of Patent: Oct. 15, 2019

(54) GLASS SHEET

(71) Applicant: Nippon Electric Glass Co., Ltd., Shiga (JP)

(72) Inventors: Hiroki Katayama, Shiga (JP); Hiroshi Nakajima, Shiga (JP)

(73) Assignee: NIPPON ELECTRIC GLASS CO., LTD., Shiga (JP)

(*) Notice: Subject to any disclaimer, the term of this patent is extended or adjusted under 35 U.S.C. 154(b) by 0 days.

(21) Appl. No.: 15/532,590

(22) PCT Filed: Dec. 4, 2015

(86) PCT No.: PCT/JP2015/084114
§ 371 (c)(1),
(2) Date: Jun. 2, 2017

(87) PCT Pub. No.: WO2016/088868
PCT Pub. Date: Jun. 9, 2016

(65) Prior Publication Data
US 2017/0334773 A1    Nov. 23, 2017

(30) Foreign Application Priority Data
Dec. 4, 2014 (JP) .................. 2014-245596

(51) Int. Cl.
*C03C 19/00* (2006.01)
*B32B 7/06* (2019.01)
(Continued)

(52) U.S. Cl.
CPC .............. *C03C 19/00* (2013.01); *B32B 7/06* (2013.01); *B32B 7/12* (2013.01); *B32B 17/06* (2013.01);
(Continued)

(58) Field of Classification Search
CPC .................................................... C03C 19/00
(Continued)

(56) References Cited

U.S. PATENT DOCUMENTS

2003/0015806 A1* 1/2003 Chiba .................. H01L 23/544
257/797
2013/0328051 A1 12/2013 Franklin et al.
(Continued)

FOREIGN PATENT DOCUMENTS

JP    2009-16771    1/2009
JP    2012-111661   6/2012
(Continued)

OTHER PUBLICATIONS

International Preliminary Report on Patentability dated Jun. 6, 2017 in International Application No. PCT/JP2015/084114.
(Continued)

*Primary Examiner* — Brent T O'Hern
(74) *Attorney, Agent, or Firm* — Wenderoth, Lind & Ponack, L.L.P.

(57) ABSTRACT

A technical object of the present invention is to devise a glass sheet that facilitates position alignment with a substrate to be processed and is less liable to be broken during conveyance, or processing treatment of the substrate to be processed, to thereby contribute to an increase in density of a semiconductor package. In order to achieve the technical object, the glass sheet of the present invention includes, in a contour thereof: a contour portion; and a position alignment portion, in which all or part of an end edge region of the position alignment portion where a surface thereof and an end surface thereof intersect is chamfered.

14 Claims, 5 Drawing Sheets

(51) Int. Cl.
- *B32B 7/12* (2006.01)
- *B32B 17/06* (2006.01)
- *C03C 3/091* (2006.01)
- *C03C 3/093* (2006.01)
- *H01L 21/56* (2006.01)
- *H01L 21/683* (2006.01)
- *C03B 17/06* (2006.01)
- *H01L 23/00* (2006.01)
- *H01L 23/31* (2006.01)

(52) U.S. Cl.
CPC .............. *C03C 3/091* (2013.01); *C03C 3/093* (2013.01); *H01L 21/561* (2013.01); *H01L 21/568* (2013.01); *H01L 21/6835* (2013.01); *C03B 17/064* (2013.01); *H01L 23/3128* (2013.01); *H01L 24/96* (2013.01); *H01L 2221/68318* (2013.01); *H01L 2224/04105* (2013.01); *H01L 2224/12105* (2013.01); *H01L 2224/95001* (2013.01); *H01L 2224/96* (2013.01)

(58) Field of Classification Search
USPC ........................................................ 428/66.7
See application file for complete search history.

(56) References Cited

U.S. PATENT DOCUMENTS

2014/0235032 A1* 8/2014 Akiyama .......... H01L 21/76256
                                                            438/458
2018/0124934 A1   5/2018 Franklin et al.

FOREIGN PATENT DOCUMENTS

JP    2014-114183    6/2014
TW     201403170    1/2014

OTHER PUBLICATIONS

International Search Report dated Mar. 1, 2016 in International Application No. PCT/JP2015/084114.
Office Action dated Sep. 20, 2018 in corresponding Taiwanese Application No. 104140733, with English translation of Search Report.

* cited by examiner

GLASS SHEET

TECHNICAL FIELD

The present invention relates to a glass sheet, and more specifically, to a glass sheet to be used for supporting a substrate to fee processed in a manufacturing process for a semiconductor package.

BACKGROUND ART

Portable electronic devices, such as a cellular phone, a notebook-size personal computer, and a personal data assistance (PDA), are required to be downsized and reduced in weight. Alone with this, a mounting space for semiconductor chips to be used in those electronic devices is strictly limited, and there is a problem of high-density mounting of the semiconductor chips. In view of this, in recent years, there has been an attempt to perform high-density mounting of a semiconductor package by a three-dimensional mounting technology, that is, by laminating semiconductor chips on top of another and connecting the semiconductor chips through wiring.

In addition, a conventional wafer level package (WLP) is manufactured by forming bumps into a wafer shape and dicing the wafer into chips. However, the conventional WLP has problems in that it is difficult to increase the number of pins, and chipping and the like of semiconductor chips are liable to occur because the semiconductor chips are mounted in a state in which the back surfaces thereof are exposed.

Therefore, as a new WLP, a fan-out type WLP has been proposed. In the fan-out type WLP, it is possible to increase the number of pins, and chipping and the like of semiconductor chips can be prevented by protecting end portions of the semiconductor chips.

The fan-out type WLP includes the step of molding a plurality of semiconductor chips with a sealing material, of a resin, to thereby form a substrate to be processed, followed by arranging wiring on one surface of the substrate to be processed, the step of forming solder bumps, and the like.

Those steps involve heat treatment at from about 200° C. to about 300° C., and hence there is a risk in that the sealing material may be deformed, and the substrate to be processed may change in dimension. When the substrate to be processed changes in dimension, it becomes difficult to arrange wiring at high density on one surface of the substrate to be processed, and it is also difficult to form the solder bumps accurately.

SUMMARY OF INVENTION

Technical Problem

In order to suppress a change in dimension of a substrate to be processed, it is effective to use a glass sheet as a supporting sheet. The glass sheet is smoothened easily on the surface thereof and has stiffness. Accordingly, when the glass sheet is used, the substrate to toe processed can be supported strongly and accurately. In addition, the glass sheet easily transmits light, for example, UV light. Accordingly, when the glass sheet is used, the substrate to be processed and the glass sheet can be easily fixed onto each other through formation of an adhesive layer or the like. In addition, the substrate to be processed and the glass sheet can also be easily separated from each other through formation of a peeling layer or the like.

The glass sheet to be used for supporting the substrate to be processed has a wafer shape that is substantially perfectly circular, as with the substrate to be processed. However, when the shape of each of the glass sheet and the substrate to be processed is substantially perfectly circular, position alignment of the glass sheet and the substrate to be processed is difficult, with the result that the wiring accuracy of the substrate to be processed is difficult to enhance.

In addition, the glass sheet has brittleness, and hence has a property of being liable to be broken. When the glass sheet is broken during conveyance or processing treatment of the substrate to toe processed, the expensive substrate to be processed is contaminated with a small glass piece or the like. Consequently, the substrate to be processed cannot be obtained as a conforming product.

The present invention has been made in view of the above-mentioned circumstances, and a technical object of the present invention is to devise a glass sheet that facilitates position alignment with a substrate to be processed and is less liable to be broken during conveyance or processing treatment of the substrate to be processed, to thereby contribute to an increase in density of a semiconductor package.

Solution to Problem

The inventors of the present invention have repeatedly conducted various experiments, and as a result, have found that the above-mentioned technical object can be achieved by forming a position alignment portion in a glass sheet and chamfering the position alignment portion. The finding is proposed as the present invention, That is, a glass sheet according to one embodiment of the present invention comprises, in a contour thereof: a contour portion; and a position alignment portion, wherein all or part of an end edge region of the position alignment portion where a surface thereof and an end surface thereof intersect is chamfered. Herein, the "position alignment portion" encompasses not only a portion configured to contribute to position alignment with a substrate to be processed, bat also a portion configured to contribute to position alignment of the glass sheet itself. The "contour portion" refers to a region occupying a contour region except for the position alignment portion.

The glass sheet according to the embodiment of the present invention comprises the position alignment portion. With this, the position of the glass sheet can be easily fixed by bringing a positioning member, for example, a positioning pin, into abutment on the position alignment portion of the glass sheet. As a result, position alignment of the glass sheet and the substrate to be processed is facilitated. Particularly when a position alignment portion is also formed in the substrate to be processed and a positioning member is brought into abutment thereon, the position alignment of the glass sheet and the substrate to be processed is further facilitated.

However, when the positioning member is brought into abutment on the position alignment portion, of the glass sheet, stress is to be concentrated in the position alignment portion, and hence the glass sheet is liable to be broken with the position alignment portion serving as an origin. Particularly when the glass sheet is curved by an external force, such tendency becomes remarkable. In view of the foregoing, in the glass sheet according to the embodiment of the present invention, all or part of the end edge region of the position alignment portion where the surface thereof and the end surface thereof intersect is chamfered. With this, breakage with the position alignment portion serving as an origin can be effectively avoided. When the position alignment portion is formed in the glass sheet, stress is concentrated in the position alignment portion. Accordingly, stress is less liable to be concentrated in the contour portion occupying a contour region except for the position alignment portion, and hence breakage with the contour portion serving as an origin cart be effectively avoided.

FIGS. 1A to 1C are top schematic views for illustrating examples of the glass sheet according to the embodiment of the present invention. As illustrated in FIG. 1A, the contour of a glass sheet 1 has a wafer shape that is-substantially perfectly circular. In addition, the glass sheet 1 comprises, in the contour thereof, a position alignment portion 2 and a contour portion 3 occupying a contour region except for the position alignment portion 2. The position alignment portion 2 has a notch shape, that is, a shape having a recess. A deep portion 4 of the notch shape has a rounded substantially circular shape in plan view, and a boundary between the position alignment portion 2 and the contour portion 3 also has a rounded substantially circular shape. As illustrated in FIG. 1B, the contour of a glass sheet 5 has a wafer shape that is substantially perfectly circular. In addition, the glass sheet 5 comprises, in the contour thereof, a position alignment portion 6 and a contour portion 7 occupying a contour region except for the position alignment portion 6. The position alignment portion 6 of the glass sheet 5 has a notch shape, and a deep portion 8 of the notch shape has a substantially V-groove shape. As illustrated in FIG. 1C, the contour of a glass sheet 9 has a wafer shape, and comprises a position alignment portion 10 and a contour portion 11 occupying a contour region except for the position alignment portion 10. The position alignment portion 10 of the glass sheet 9 has an orientation flat shape.

Secondly, it is preferred that in the glass sheet according to the embodiment of the present invention, the position alignment portion have a chamfer width in a surface direction thereof of from 50 μm to 900 μm.

Thirdly, it is preferred that in the glass sheet according to the embodiment of the present invention, the position alignment portion have a chamfer width in a thickness direction thereof of from 5% to 80% of a thickness thereof.

FIG. 2 is a sectional schematic view taken along the line A-A' of FIG. 1A. As illustrated in FIG. 2, a glass sheet 20 has chamfered surfaces 24, 25 in end edge regions where surfaces 21, 22 thereof and an end surface 23 thereof intersect. A chamfer width X in the direction of each of the surfaces 21, 22 of the glass sheet 20 is, for example, from 50 μm to 900 μm, and a chamfer width Y+Y' in the thickness direction of the glass sheet 20 is, for example, from 20% to 80% of a thickness t thereof. In addition, the end surface 23 is connected to each of the chamfered surfaces 24, 25 in a continuously rounded state, and the surfaces 21, 22 are connected to the chamfered surfaces 24, 25, respectively, in a continuously rounded state.

The chamfered surfaces 24, 25 illustrated in FIG. 2 have substantially equal chamfer widths in the surface direction of the position alignment portion, and also have substantially equal chamfer widths in the thickness direction thereof. However, the chamfered surfaces 24, 25 may have different chamfer widths. In addition, the chamfered surface may be formed in only one of the surfaces 21, 22.

FIGS. 3A to 3C are sectional schematic views for illustrating examples of the glass sheet according to the embodiment of the present invention, and are sectional schematic views for illustrating modification modes of the chamfer shape of the position alignment portion. In each of glass sheets illustrated in FIG. 3A and FIG. 3B, a chamfered surface is formed in only one of the end edge regions of the position alignment portion where the surfaces thereof and the end surface thereof intersect. In a glass sheet illustrated in FIG. 3C, a chamfered surface is formed in only one of the end edge regions of the position alignment portion where the surfaces thereof and the end surface thereof intersect, and the chamfered surface occupies the entire end surface of the position alignment portion.

Fourthly, it is preferred that the glass, sheet according to the embodiment of the present invention have a chamfered surface in the end edge region of the position alignment portion where the surface thereof and the end surface thereof intersect, and the chamfered surface have an average surface roughness Ra of 0.20 μm or less. Herein, the "average surface roughness" refers to a value measured in accordance with JIS B0601:2001.

Fifthly, it is preferred that the glass sheet according to the embodiment of the present invention have a chamfered surface in the end edge region of the position alignment portion where the surface thereof and the end surface thereof intersect, and the chamfered surface and the end surface be connected to each other in a continuously rounded state, that is, the chamfered surface and the end surface be connected to each other with a continuous curved surface.

Sixthly, it is preferred that in the glass sheet according to the embodiment of the present invention, the position alignment portion have a notch shape.

Seventhly, it is preferred that in the glass sheet according to the embodiment of the present invention, all or part of the contour portion be chamfered, and the contour portion have a chamfer width in a surface direction thereof of from 50 μm to 900 μm.

Eighthly, it is preferred that in the glass sheet according to the embodiment of the present invention, the contour have a wafer shape.

Ninthly, it is preferred that the glass sheet according to the embodiment of the present invention have a total thickness variation of less than 2.0 μm. When the total thickness variation is decreased, the accuracy of processing treatment can be easily enhanced. In particular, wiring accuracy can be enhanced, and hence high-density wiring can be performed. In addition, the in-plane strength of the glass sheet is improved, and hence the glass sheet and the laminate are less liable to be broken. Further, the number of times of reuse (number of endurable uses) of the glass sheet can be increased. Herein, the "total thickness variation" is a difference between the maximum thickness and the minimum thickness of the entire glass sheet, and may be measured with, for example, SBW-331ML/d manufactured by Kobelco Research Institute, Inc.

Tenthly, it preferred that the glass sheet according to the embodiment of the present invention be formed by an overflow down-draw method.

Eleventhly, it is preferred that the glass sheet according to the embodiment of the present invention be used for supporting a substrate to be processed in a manufacturing process for a semiconductor package.

Twelfthly, it is preferred that a laminate according to one embodiment, of the present invention comprise at least a substrate to be processed and a glass sheet configured to support the substrate to be processed, the glass sheet comprising the above-mentioned glass sheet.

FIG. 4 is a schematic perspective view for illustrating an example of a state in which the position of a laminate 31 according to one embodiment of the present invention is fixed with positioning members 32. In FIG. 4, the laminate 31 comprises a substrate 35 to be processes and a glass sheet 36 configured to support the substrate 35 to be processed. The substrate 35 to be processed and the glass sheet 36 are bonded onto each other in order to prevent a change in dimension of the substrate 35 to be processed. The substrate 35 to be processed comprises a position alignment portion 37, and the glass sheet 36 also comprises a position alignment portion 38. The positioning member 32 is brought into abutment on the position alignment portion 37 of the substrate 35 to be processed and the position alignment portion 38 of the glass sheet 36. Thus, position alignment of the substrate 35 to be processed and the glass sheet 36 is performed. In addition, the positioning members 33, 34 are brought into abutment on a contour portion 39 of the substrate 35 to be processed and a contour portion 40 of the glass sheet 36. In addition, the positions of the substrate 35 to be processed and the glass sheet 36 are fixed with the positioning members 33, 34. Between substrate 35 to be processed and the glass sheet 36, a peeling layer and an adhesive layer (not shown) are arranged. The adhesive layer is brought into contact with the substrate 35 to be processed, and the peeling layer is brought into contact with the glass sheet 36. In FIG. 4, the position alignment portion 37 of the substrate 35 to be processed and the position alignment portion 38 of the glass sheet 36 are brought into abutment on the positioning member 32, but a position alignment portion, may be formed in each of regions to be brought into abutment on the positioning members 33, 34. In this case, the position alignment of the substrate 35 to be processed and the glass sheet 36 can be reliably performed.

Thirteenthly, it is preferred that a method of manufacturing a semiconductor package according to one embodiment of the present invention comprise the steps of: preparing a laminate including at least a substrate to be processed and a glass sheet configured to support the substrate to be processed; and subjecting the substrate to be processed to a processing treatment, the glass comprising the above-mentioned glass sheet.

Fourteenthly, it is preferred that in the method of manufacturing a semiconductor package according to the embodiment of the present invention, the processing treatment comprise a step of arranging wiring on one surface of the substrate to be processed.

Fifteenthly, it is preferred that in the method of manufacturing a semiconductor package according to the embodiment of the present invention, the processing treatment comprise a step of forming a solder bump on the one surface of the substrate to foe processed.

Sixteenthly, it is preferred that a semiconductor package according to one embodiment of the present invention be manufactured by the above-mentioned method of manufacturing a semiconductor package.

Seventeenthly, it is preferred that an electronic device according to one embodiment of the present invention comprise a semiconductor package, the semiconductor package comprising the above-mentioned semiconductor package.

DESCRIPTION OF EMBODIMENTS

Figure 1A:
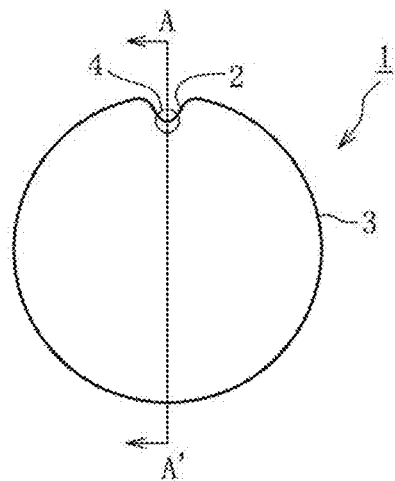
FIG. 1A is a top schematic view for an illustrating example of a glass sheet of the present invention.
Figure 1B:
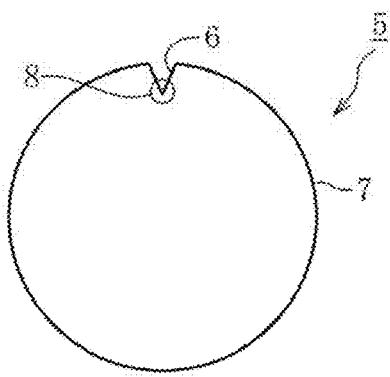
FIG. 1B is a top schematic view for an illustrating example of a glass sheet of the present invention.
Figure 1C:
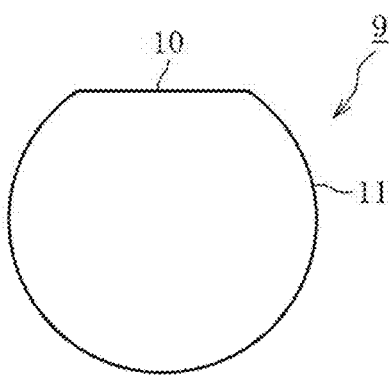
FIG. 1C is a top schematic view for an illustrating example of a glass sheet of the present invention.
Figure 2:
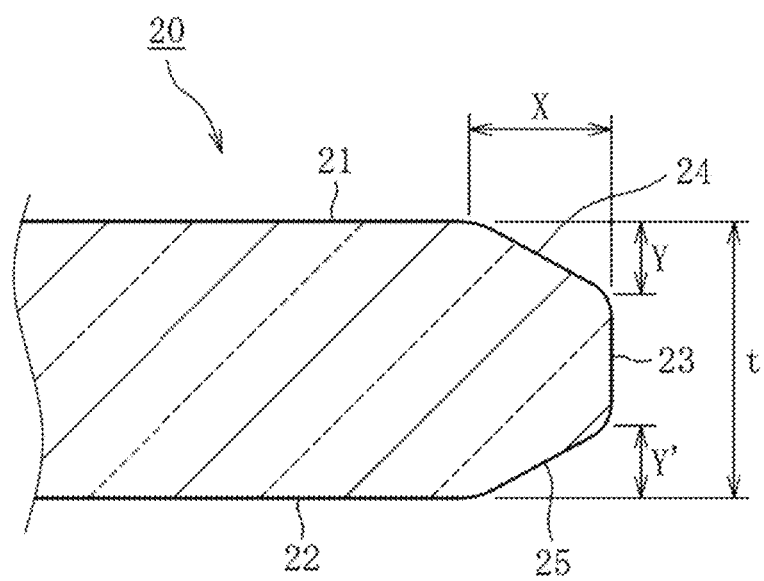
FIG. 2 is a sectional schematic view taken along the line A-A' of FIG. 1A.
Figure 3A:
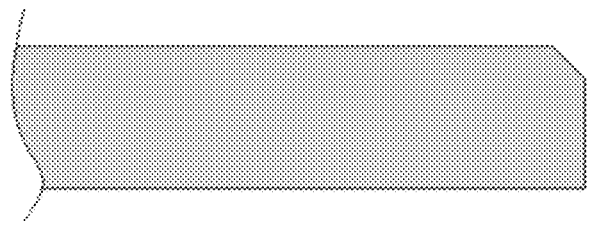
FIG. 3A is a sectional schematic view for an illustrating modification mode of the chamfer shape of a position alignment portion of the glass sheet of the present invention.
Figure 3B:
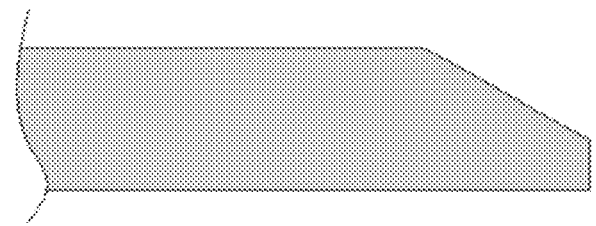
FIG. 3B is a sectional schematic view for an illustrating modification mode of the chamfer shape of a position alignment portion of the glass sheet of the present invention.
Figure 3C:
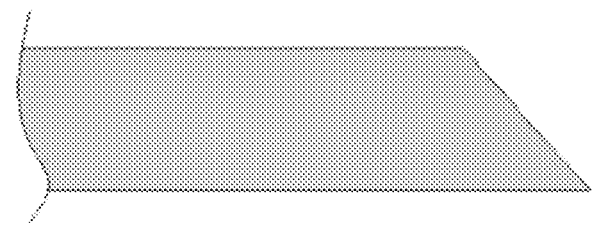
FIG. 3C is a sectional schematic view for an illustrating modification mode of the chamfer shape of a position alignment portion of the glass sheet of the present invention.
Figure 4:
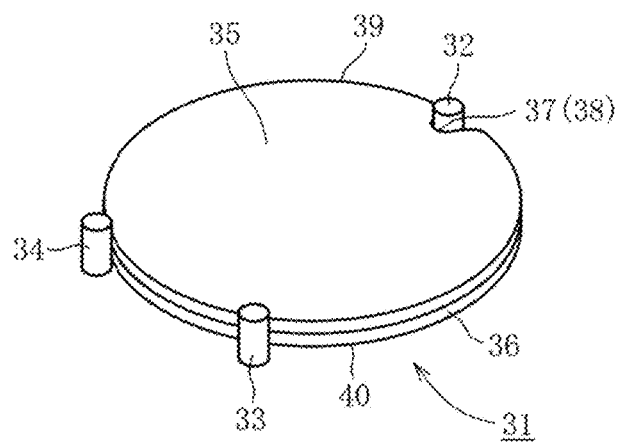
FIG. 4 is a schematic perspective view for illustrating an example of a state in which the position of a laminate of the present invention is fixed with positioning members.

A glass sheet of the present invention comprises a position alignment portion, and the shape of the position alignment portion is not limited. For example, a notch shape or an orientation flat shape may be adopted. Of those, from the viewpoint of facilitating fixing of a positioning member, a notch shape is preferred, and it is more preferred that a deep portion of the notch shape have a substantially circular shape or a substantially V-groove shape in plan view. In addition, the glass sheet may comprise a plurality of position alignment portions instead of only one position alignment portion. When the glass sheet comprises one position alignment portion, the position alignment portion can be easily formed. When the glass sheet comprises a plurality of position alignment portions, position alignment of the glass sheet can be reliably performed.

Chamfering processing is preferably performed by polishing processing from the viewpoint of processability, and the polishing processing is more preferably performed with a polishing roughness of preferably #500 or more, #800 or more, or #1200 or more. The chamfering processing may be performed by chemical etching or the like instead of the polishing processing.

In the glass sheet of the present invention, all or part of an end edge region of the position alignment portion where a surface thereof and an end surface thereof intersect is chamfered. It is preferred that 50% or more of the end edge region of the position alignment portion where the surface thereof and the end surface thereof intersect be chamfered. It is more preferred that 90% or more of the end edge region of the position alignment portion where the surface thereof and the end surface thereof intersect be chamfered. It is still more preferred that all of the end edge region of the position alignment portion where the surface thereof and the end surface thereof intersect be chamfered. As the chamfered region in the position alignment portion increases, the probability of breakage with the position alignment portion serving as an origin can be reduced.

In the glass sheet of the present invention, the chamfer shape of the position alignment portion is not particularly limited, but is preferably a chamfer shape to be described later. The present invention does not completely exclude a mode in which all or part of the position alignment portion is R-chamfered, that is, a mode in which the entire end surface of the position alignment portion is chamfered into a substantially semicircular shape. However, in this case, stress is liable to be concentrated on one point at the apex of the R-chamfering, and hence the probability of breakage with the position alignment portion serving as an origin is difficult to reduce.

The chamfer width of the position alignment portion in the surface direction thereof is preferably from 50 µm to 900 µm, from 200 µm to 800 µm, from 300 urn to 700 µm, or from 400 µm to 650 µm, particularly preferably from 500 µm to 600 µm. When the chamfer width of the position alignment portion in the surface direction thereof is excessively small, the glass sheet is liable to the broken with the position alignment portion serving as an origin. Meanwhile, when the chamfer width of the position alignment portion in the surface direction thereof is excessively large, chamfering efficiency is liable to lower to increase the manufacturing cost of the glass sheet.

The chamfer width of the position alignment portion in the thickness direction thereof is preferably from 5% to 80%, from 20% to 75%, from 30% to 70%, or from 35% to 65%, particularly preferably from 40% to 60% of the thickness thereof. When the chamfer width of the position alignment portion in the thickness direction thereof is excessively small, the glass sheet is liable to be broken with the position alignment portion serving as an origin. Meanwhile, when the chamfer width of the position alignment portion in the thickness direction thereof is excessively large, an external force is liable to be concentrated on the end surface of the position alignment portion, and hence the glass sheet is liable to be broken with the end surface of the position alignment portion serving as an origin.

The glass sheet of the present invention preferably has a chamfered surface in the end edge region of the position alignment portion where the surface thereof and the end surface thereof intersect. The average surface roughness Ra of the chamfered surface is preferably 0.20 µm or less, less than 0.10 µm, 0.08 µm or less, or 0.06 µm or less, particularly preferably 0.04 µm or less. When the average surface roughness Ra of the chamfered surface is excessively large, the fracture strength of the glass sheet in a four-point Pending test is liable to lower, and hence the glass sheet is liable to be broken with the position alignment portion serving as an origin. The maximum surface roughness Rz of the chamfered surface is preferably 0.25 µm or less, less than 0.13 µm, 0.10 µm or less, or 0.08 µm or less, particularly preferably 0.06 µm or less. When the maximum surface roughness Rz of the chamfered surface is excessively large, the fracture strength of the glass sheet in the four-point bending test is liable to lower, and hence the glass sheet is liable to be broken with the position alignment portion serving as an origin. When the chamfered surface is subjected to mirror surface polishing treatment, etching treatment, or the like, the surface roughness of the chamfered surface can be lowered.

It is preferred that the glass sheet of the present invention have a chamfered surface in the end edge region of the position alignment portion where the surface thereof and the end surface thereof intersect, and that the chamfered surface and the end surface be connected to each other in a continuously rounded state. It is also preferred that the chamfered surface and the surface be connected to each other in a continuously rounded state. With this, the probability of breakage with the position alignment portion serving as an origin can be effectively reduced.

In the glass sheet of the present invention, it is preferred that all or part of an end edge region of a contour portion occupying a contour region except for the position alignment portion where a surface thereof and an end surface thereof intersect be chamfered. It is more preferred that 50% or more of the end edge region of the contour portion where the surface thereof and the end surface thereof intersect be chamfered. It is still more preferred that 90% or more of the end edge region of the contour portion where the surface thereof and the end surface thereof intersect be chamfered. It is particularly preferred that all of the end edge region of the contour portion where the surface thereof and the end surface thereof intersect be chamfered. As the chamfered region in the contour portion increases, the probability of breakage with the contour portion serving as an origin can fee reduced.

The chamfer width of the contour portion in the surface direction thereof is preferably from 50 µm to 900 µm, from 200 µm to 800 µm, from 300 µm to 700 µm, or from 400 µm to 658 µm, particularly preferably from 500 µm to 600 µm. When the chamfer width of the contour portion in the surface direction thereof is excessively small, the glass sheet is liable to be broken with the contour portion serving as an origin. Meanwhile, when the chamfer width of the contour portion in the surface direction thereof is excessively large, chamfering efficiency is liable to lower to increase the manufacturing cost of the glass sheet.

The chamfer width of the contour portion in the thickness direction thereof is preferably from 5% to 80%, from 20% to 75%, from 30% to 70%, or from 35% to 65%, particularly preferably from 40% to 60% of the thickness thereof. When the chamfer width of the contour portion in the thickness direction thereof is excessively small, the glass sheet is liable to be broken with the contour portion serving as an origin. Meanwhile, when the chamfer width of the contour portion in the thickness direction thereof is excessively large, an external force is liable to be concentrated on the end surface of the contour portion, and hence the glass sheet is liable to toe broken with the end surface of the contour portion serving as an origin.

The glass sheet of the present invention preferably has a chamfered surface in the end edge region of the contour portion where the surface thereof and the end surface thereof intersect. The average surface roughness Ra of the chamfered surface is preferably 0.20 µm or less, less than 0.10 µm, 0.08 µm or less, or 0.06 µm or less, particularly preferably 0.04 µm or less. When the average surface roughness Ra of the chamfered surface is excessively large, the fracture strength of the glass sheet in a four-point bending test Is liable to lower, and hence the glass sheet is liable to be broken with the contour portion serving as an origin. The maximum surface roughness Rz of the chamfered surface is preferably 0.25 µm or less, less than 0.13 µm, 0.10 µm or less, or 0.08 µm or less, particularly preferably 0.06 µm or less. When the maximum surface roughness Rz of the chamfered surface is excessively large, the fracture strength of the glass sheet in the four-point bending test is liable to lower, and hence the glass sheet is liable to be broken with the contour portion serving as an origin. When the chamfered surface is subjected to mirror surface polishing treatment, etching treatment, or the like, the surface roughness of the chamfered surface can be lowered.

It is preferred that the glass sheet of the present invention have a chamfered surface in the end edge region or the contour portion where the surface thereof and the end surface thereof intersect, and that the chamfered surface and the end surface be connected to each other in a continuously rounded state. It is also preferred that the chamfered surface and the surface be connected to each other in a continuously rounded state. With this, the probability of breakage with the contour portion serving as ah origin can be effectively reduced.

From the viewpoint of reducing the probability of breakage with the position alignment portion serving as an origin, it is preferred that a boundary between the position alignment portion and the contour portion be connected in a continuously rounded state.

In the glass sheet of the present invention, the total thickness variation is preferably less than 2 µm, 1.5 µm or less, 1 µm or less, less than 1 µm, 0.8 µm or less, or from 0.1 µm to 0.9 µm, particularly preferably from 0.2 µm to 0.7 µm. As the total thickness variation becomes smaller, the accuracy of processing treatment can be enhanced easily. In particular, wiring accuracy can be enhanced, and hence high-density wiring can be performed. The strength of the glass sheet is improved, and hence the glass sheet and the laminate are less liable to be broken. Further, the number of times of reuse (number of endurable uses) of the glass sheet can be increased.

The warpage level is preferably 60 µm or less, 55 µm or less, 50 µm or less, or from 1 µm to 45 µm, particularly preferably from 5 µm to 40 µm. As the warpage level becomes smaller, the accuracy of the processing treatment can be enhanced easily. In particular, the wiring accuracy can be enhanced, and hence high-density wiring can be performed. Further, the number of times of reuse (number of endurable uses) of the glass sheet can be increased. The "warpage level" refers to the total of the absolute value of the maximum distance between the highest point and the least squares focal plane of the entire glass sheet, and the absolute value of the distance between the lowest point and the least squares focal plane thereof, and may be measured with, for example, SBW-331ML/d manufactured by Kobelco Research Institute, Inc.

The arithmetic average roughness Ra of the surface is preferably 10 nm or less, 5 nm or less, 2 nm or less, or 1 nm or less, particularly preferably 0.5 nm or less. As the arithmetic average roughness Ra of the surface becomes smaller, the accuracy of the processing treatment can be enhanced easily. In particular, the wiring accuracy can be enhanced, and hence high-density wiring can be performed. The strength of the glass sheet is improved, and hence the glass sheet and the laminate are less liable to be broken. Further, the number of times of reuse (number of times of support) of the glass sheet can be increased. The "arithmetic average roughness Ra" may be measured with an atomic force microscope (AFM).

It is preferred that ail or part of a surface of the glass sheet of the present invention be a polished surface. In terms of area ratio, it is more preferred that 50% or more of the surface foe a polished surface, it is still more preferred that 70% or more of the surface be a polished surface, and it is particularly preferred that 90% or more of the surface be a polished surface. With this, the total thickness variation can be easily reduced, and the warpage level can also be easily reduced.

As a method for the polishing treatment, various methods may be adopted. However, a method involving sandwiching both surfaces of a glass sheet with a pair of polishing pads and subjecting the glass sheet to polishing treatment while rotating the glass sheet and the pair of polishing pads together is preferred. Further, it is preferred that the pair of polishing pads have different outer diameters, and it is preferred that the polishing treatment be performed so that part of the glass sheet intermittently extends off the polishing pads during polishing. With this, the total thickness variation can be easily reduced, and the warpage level can also be easily reduced. In the polishing treatment, a polishing depth is not particularly limited, but the polishing depth is preferably 50 µm or less, 3.0 µm or less, or 20 µm or less, particularly preferably 10 µm or less. As the polishing depth becomes smaller, the productivity of the glass sheet is improved.

The glass sheet of the present invention preferably has a wafer shape (substantially perfectly circular shape), and the diameter thereof is preferably 100 mm or more and 500 mm or less, particularly preferably 150 mm or more and 450 mm or less. With this, the glass sheet is easily applied to the manufacturing process for a semiconductor package.

In the glass sheet of the present invention, the thickness is preferably less than 2.0 mm, 1.5 mm or less, 1.2 mm or less, 1.1 mm or less, or 1.0 mm or less, particularly preferably 0.9 mm or less. As the thickness becomes smaller, the mass of the laminate is reduced in weight, and hence a handling property is enhanced. Meanwhile, when the thickness is excessively small, the strength of the glass sheet itself decreases, and hence the glass sheet cannot serve a function of a supporting substrate. Thus, the thickness is preferably 0.1 mm or more, 0.2 mm or more, 0.3 mm or more, 0.4 mm or more, 0.5 mm or more, or 0.6 mm or more, particularly preferably more than 0.7 mm.

It is preferred that the glass sheet of the present invention have the following characteristics.

In the glass sheet of the present invention, it is preferred that the average thermal expansion coefficient within a temperature range of from 30° C. to 380° C. be $0 \times 10^{-7}$/° C. or more and $165 \times 10^{-7}$/° C. or less. With this, the thermal expansion coefficients of the substrate to be processed and the glass sheet are easily matched with each other. When the thermal expansion coefficients of the substrate to be processed and the glass sheet are matched with each other, a change in dimension (in particular, warping deformation) of the substrate to be processed during the processing treatment is suppressed easily. As a result, wiring can be arranged at high density on one surface of the substrate to be processed, and solder bumps can also be formed thereon accurately. The "average thermal expansion coefficient within a temperature range of from 30° C. to 380° C." may be measured with a dilatometer.

It is preferred that the average thermal expansion coefficient within a temperature range of from 30° C. to 380° C. be increased when the ratio of the semiconductor chips within the substrate to be processed is small and the ratio of the sealing material within the substrate to be processed is large. Meanwhile, it is preferred that the average thermal expansion coefficient be decreased when the ratio of the semi conductor chips within the substrate to be processed is large and the ratio of the sealing material within the substrate to be processed is small.

When the average thermal expansion coefficient within a temperature range of from 30° C. to 330° C. is set to $0 \times 10^{-7}$/° C. or more and less than $50 \times 10^{-7}$/° C., the glass sheet preferably comprises as a glass composition, in terms of mass %, 55% to 75% of $SiO_2$, 15% to 30% of: $Al_2O_3$, 0.1% to 6% of $Li_2O$, 0% to 8% of $Na_2O+K_2O$, and 0% to 10% of $MgO+CaO+SrO+BaO$, or preferably comprises 55% to 75% of $SiO_2$, 10% to 30% of $Al_2O_3$, 0% to 0.3% of $Li_2O+Na_2O+K_2O$, and 5% to 20% of $MgO+CaO+SrO+BaO$. When the average thermal expansion coefficient within a temperature range of from 30° C. to 380° C. is set to $50\times10^{-7}$/° C. or more and less than $75\times10^{-7}$/° C., the glass sheet preferably comprises as a, glass composition, in terms of mass %, 55% to 70% of $SiO_2$, 3% to 15% of $Al_2O_3$, 5% to 20% of $B_2O_3$, 0% to 5% of MgO, 0% to 10% of CaO, 0% to 5% of SrO, 0% to 55 of BaO, 0% to 5% of ZnO, 5% to 15% of $Na_2O$, and 0% to 10% of $K_2O$. When the average thermal expansion coefficient within a temperature range of from 30° C. to 380° C. is set to $750\times10^{-7}$/° C. or more and $85\times10^{-7}$/° C. or less, the glass sheet preferably comprises as a glass composition, in terms of mass %, 60% to 75% of $SiO_2$, 5% to 15% of $Al_2O_3$, 5% to 20% of $B_2O_3$, 0% to 5% of MgO, 0% to 10% of CaO, 0% to 5% of SrO, 0% to 5% of BaO, 0% to 5% of ZnO, 7% to 16% of $Na_2O$, and 0% to 8% of $K_2O$. When the average thermal expansion coefficient within a temperature range of from 30° C. to 380° C. is set to more than $85\times10^{-7}$/° C. and $120\times10^{-7}$/° C. or less, the glass sheet preferably comprises as a glass composition, in terms of mass %, 55% to 70% of $SiO_2$, 3% to 13% of $Al_2O_3$, 2% to 8% of $B_2O_3$, 0% to 5% of MgO, 0% to 10% of CaO, 0% to 5% of SrO, 0% to 5% of BaO, 0% to 5% of ZnO, 10% to 21% of $Na_2O$, and 0% to: 5% of $K_2O$. When the average thermal expansion coefficient within a temperature range of from 30° C. to 380° C. is set to more than $120\times10^{-7}$/° C. and $165\times10^{-7}$/° C. or less, the glass sheet preferably comprises as a glass composition, in terms of mass %, 53% to 65% of $SiO_2$, 3% to 13% of $Al_2O_3$, 0% to 5% of $B_2O_3$, 0.1% to 6% of MgO, 0% to 10% of Cad, 0% to 5% of SrO, 0% to 5% of BaO, 0% to 5% of ZnO, 20% to 40% of $Na_2O+K_2O$, 12% to 21% of $Na_2O$, and 7% to 21% of $K_2O$. With this, the thermal expansion coefficient is regulated easily within a desired range, and devitrification resistance is enhanced. Therefore, a glass sheet having a small total thickness variation is formed easily. A difference in thermal expansion coefficient between the glass sheet and the substrate to be processed is preferably as small as possible in order to suppress a change in dimension of the substrate to be processed, and is, for example, preferably $\pm20\times10^{-7}$/° C. or less, or $\pm10\times10^{-7}$/° C. or less, particularly preferably $\pm5\times10^{-7}$/° C. or less.

The Young's modulus is preferably 65 GPa or more, 67 GPa or more, 68 GPa or more, 69 GPa or more, 70 GPa or more, 71 GPa or more, or 72 GPa or more, particularly preferably 73 GPa or more. When the Young's modulus is excessively low, it becomes difficult to maintain the stiffness of the laminate, and the deformation, warpage, and breakage of the substrate to be processed are liable to occur.

The liquidus temperature is preferably less than 1,150° C., 1,120° C. or less, 1,100° C. or less, 1,080° C. or less, 1,050° C. or less, 1,010° C. or less, 980° C. or less, 960° C. or less, or 950° C. or less, particularly preferably 940° C. or less. With this, a glass sheet is formed easily by a down-draw method, in particular, an overflow down-draw method. Therefore, a glass sheet having a small thickness is manufactured easily, and the thickness variation after forming can be reduced. Further, in a manufacturing process for the glass sheet, a situation in which a devitrified crystal is generated to decrease the productivity of the glass sheet is prevented easily. The "liquidus temperature" may be calculated by loading glass powder that has passed through a standard 30-mesh sieve (500 µm) and remained on a 50-mesh sieve (300 µm) into a platinum boat, then keeping the glass powder for 24 hours in a gradient heating furnace, and measuring a temperature at which crystals of glass are deposited.

The viscosity at a liquidus temperature is preferably $10^{4.6}$ dPa·s or more, $10^{5.0}$ dPa·s or more, $10^{5.2}$ dPa·s or more, $10^{5.4}$ dPa·s or more, or $10^{5.6}$ dPa·s or more, particularly preferably $10^{5.8}$ dPa·s or more. With this, a glass sheet is formed easily by a down-draw method, in particular, an overflow down-draw method. Therefore, a glass sheet having a small thickness is manufactured easily, and the thickness variation after forming can be reduced. Further, in a manufacturing process for the glass sheet, a situation in which a devitrified crystal is generated to decrease the productivity of the glass sheet is prevented easily. The "viscosity at a liquidus temperature" may be measured by a platinum sphere pull up method. The viscosity at a liquidus temperature is an indicator of formability. As the viscosity at a liquidus temperature becomes higher, the formability is enhanced.

The temperature at $10^{2.5}$ dPa·s is preferably 1,580° C. or less, 1,500° C. or less, 1,450° C. or less, 1,400° C. or less, or 1,350° C. or less, particularly preferably from 1,200° C. to 1,300° C. When the temperature at $10^{2.5}$ dPa·s increases, meltability is degraded, and the manufacturing cost of a glass sheet rises. The "temperature at $10^{2.5}$ dPa·s" can be measured by the platinum sphere pull up method. The temperature at $10^{2.5}$ dPa·s corresponds to a melting temperature. As the melting temperature becomes lower, the meltability is enhanced.

In the glass sheet of the present invention, a UV transmittance at a wavelength of 300 nm in the thickness direction is preferably 40% or more, 50% or more, 60% or more, or 70% or more, particularly preferably 80% or more. When the W transmittance is excessively low, it becomes difficult to cause the substrate to be processed and the glass sheet to adhere to each other with an adhesive layer through irradiation with UV rays, and in addition, it becomes difficult to peel the glass sheet from the substrate to be processed with a peeling layer through irradiation with the UV rays. The "UV transmittance at a wavelength of 300 nm in the thickness direction" may be evaluated by, for example, measuring a spectral transmittance at a wavelength of 300 nm with a double-beam type spectrophotometer.

The glass sheet of the present invention is preferably formed by a down-draw method, in particular, an overflow down-draw method. The overflow down-draw method refers to a method in which a molten glass is caused to overflow from both sides of a heat-resistant, trough-shaped structure, and the overflowing molten glasses are subjected to down-draw downward at the lower end of the trough-shaped structure while being joined, to thereby form a mother glass sheet. When a glass sheet is produced by the overflow down-draw method, surfaces that are to serve as the surfaces of the glass sheet are formed in a state of free surfaces without being brought into contact with the trough-shaped refractory. Therefore, a glass sheet having a small thickness is manufactured easily, and the total thickness variation can be reduced. As a result, the manufacturing cost of the glass sheet can be reduced.

As a method of forming a mother glass sheet, besides the overflow down-draw method, for example, a slot down method, a redraw method, a float method, a roll-out method, or the like may also be adopted.

It is preferred that the glass sheet of the present invention have a polished surface on a surface thereof and be formed by the overflow down-draw method. With this, the total thickness variation before the polishing treatment is reduced, and hence the total thickness variation can be reduced to the extent possible through the polishing treatment. The total thickness variation can be reduced to, for example, 1.0 µm or less.

From the viewpoint of reducing the warpage level, it is preferred that the glass sheet of the present invention be subjected to no chemical tempering treatment. Meanwhile, from the viewpoint of mechanical strength, it is preferred that the glass sheet be subjected to chemical tempering treatment. That is, from the viewpoint of reducing the warpage level, it is preferred that the glass sheet have no compressive stress layer in the surface thereof, and from the viewpoint of mechanical strength, it is preferred that the glass sheet have a compressive stress layer in the surface thereof.

The laminate of the present invention has a feature of comprising at least a substrate to be processed and a glass sheet configured to support the substrate to be processed, the glass sheet comprising the above-mentioned glass sheet. Here, the technical features (preferred configuration and effects) of the laminate of the present invention overlap the technical features of the glass sheet of the present invention. Thus, the details of the overlapping portions are omitted in this description.

It is preferred that the laminate of the present invention comprise an adhesive layer between the substrate to be processed and the glass sheet. It is preferred that the adhesive layer be formed of a resin, and for example, a thermosetting resin, a photocurable resin (in particular, a UV-curable resin), and the like are preferred. It is preferred that the adhesive layer have heat resistance that withstands the heat treatment in the manufacturing process for a semiconductor package. With this, the adhesive layer is less liable to be melted in the manufacturing process for a semiconductor package, and the accuracy of the processing treatment can be enhanced.

The adhesive layer may be formed, for example, by any of various printing methods, an ink-jet method, a spin coating method, and a roll coating method.

It is preferred that the laminate of the present invention further comprise a peeling layer between the substrate to be processed and the glass sheet, more specifically, between the substrate to be processed and the adhesive layer, or further comprise a peeling layer between the glass sheet and the adhesive layer. With this, after the substrate to fee processed is subjected to predetermined processing treatment, the substrate to be processed is easily peeled from the class sheet. From the viewpoint of productivity, it is preferred that the substrate to be processed be peeled from the glass sheet through irradiation with laser light or the like.

The peeling layer is formed of a material in which "in-layer peeling" or "interfacial peeling" occurs through irradiation with laser light or the like, That is, the peeling layer is formed of a material in which the interatomic or intermolecular binding force between atoms or molecules is lost or reduced to cause ablation or the like, to thereby cause peeling, through irradiation with light having predetermined intensity. For example, in the peeling layer, silicon oxide, a silicate compound, silicon nitride, aluminum nitride, titanium nitride, or the like may be used besides amorphous silicon (a-Si). In addition, the peeling layer may be formed by plasma CVD, spin coating using a sol-gel method, or the like. There are the case where components contained in the peeling layer turn into a gas to be released, to thereby cause separation, through irradiation with light, and the case where the peeling layer absorbs light to turn into a gas and the vapor thereof is released, to thereby cause separation.

In the laminate of the present invention, it is preferred that the glass sheet be larger than the substrate to be processed. With this, even when the center positions of the substrate to be processed and the glass sheet are slightly separated from each other at a time when the substrate to be processed and the glass sheet are supported, an edge portion of the substrate to be processed is less liable to extend off from the glass sheet.

A method of manufacturing a semiconductor package of the present invention has a feature of comprising the steps of: preparing a laminate including at least a substrate to be processed and a glass sheet configured to support the substrate to be processed; and subjecting the substrate to be processed to processing treatment, the glass sheet comprising the above-mentioned glass sheet. Here, the technical features (preferred configuration and effects) of the method of manufacturing a semiconductor package of the present invention overlap the technical features of the glass sheet and laminate of the present invention. Thus, the details of the overlapping portions are omitted in this description.

The method of manufacturing a semiconductor package of the present invention comprises the step of preparing a laminate including at least a substrate to be processed and a glass sheet configured to support the substrate to be processed. The laminate including at least a substrate to be processed and a glass sheet configured to support the substrate to be processed has the above-mentioned material construction.

It is preferred that the method of manufacturing a semiconductor package of the present invention further comprise the step of conveying the laminate. With this, the treatment efficiency of the processing treatment can be enhanced. The "step of conveying the laminate" and the "step of subjecting the substrate to be processed to processing treatment" are not required to be performed separately, and may be performed simultaneously.

In the method of manufacturing a semiconductor package of the present invention, it is preferred that the processing treatment be treatment involving arranging wiring on one surface of the substrate to be processed or treatment involving forming solder bumps on one surface of the substrate to be processed. In the method of manufacturing a semiconductor package of the present invention, during the treatment, the substrate to be processed is less liable to be changed in dimension, and hence those steps can be performed properly.

Besides the foregoing, the processing treatment may be any of treatment involving mechanically polishing one surface (in general, the surface on an opposite side to the glass sheet) of the substrate to be processed, treatment involving subjecting one surface (in general, the surface on an opposite side to the glass sheet) of the substrate to be processed to dry etching, and treatment involving subjecting one surface (in general, the surface on an opposite side to the glass sheet) of the substrate to be processed to wet etching. In the method of manufacturing a semiconductor package of the present invention, warpage is less liable to occur in the substrate to be processed, and the stiffness of the laminate can be maintained. As a result, the processing treatment can be performed properly.

The semiconductor package of the present invention has a feature of being manufactured by the above-mentioned method of manufacturing a semiconductor package. Here, the technical features (preferred configuration and effects) of the semiconductor package of the present invention overlap the technical features of the glass sheet, laminate, and method of manufacturing a semiconductor package of the present invention. Thus, the details of the overlapping portions are omitted in this description.

The electronic device of the present invention has a feature of comprising a semiconductor package, the semiconductor package comprising the above-mentioned semiconductor package. Here, the technical features (preferred configuration and effects) of the electronic device of the present invention overlap the technical features of the glass sheet, laminate, method of manufacturing a semiconductor package, and semiconductor package of the present invention. Thus, the details of the overlapping portions are omitted in this description.

The method of manufacturing a semiconductor package of the present invention is further described with reference to the drawings.

Figure 5A:
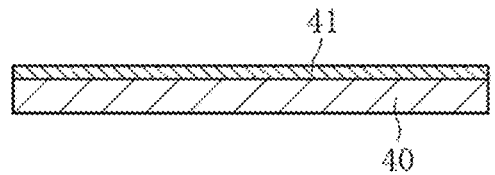
FIG. 5A is a schematic sectional view for illustrating a manufacturing process for a fan-out type WLP.
Figure 5B:
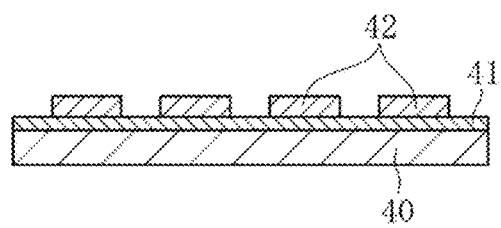
FIG. 5B is a schematic sectional view for illustrating a manufacturing process for a fan-out type WLP.
Figure 5C:
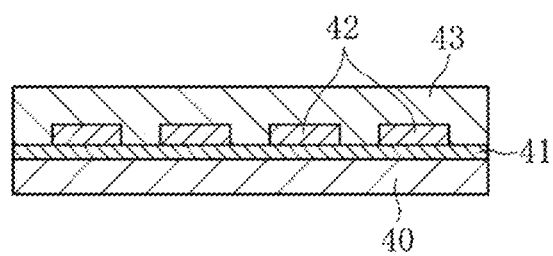
FIG. 5C is a schematic sectional view for illustrating a manufacturing process for a fan-out type WLP.
Figure 5D:
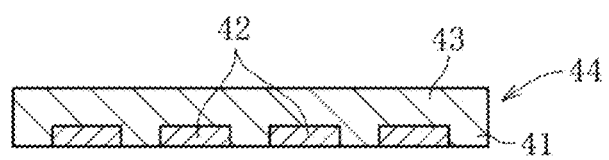
FIG. 5D is a schematic sectional view for illustrating a manufacturing process for a fan-out type WLP.
Figure 5E:
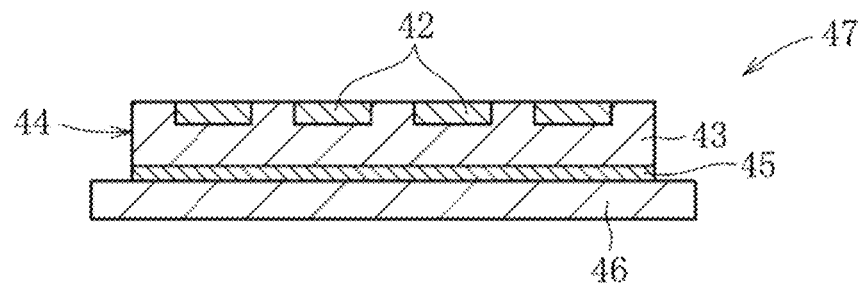
FIG. 5E is a schematic sectional view for illustrating a manufacturing process for a fan-out type WLP.
Figure 5F:
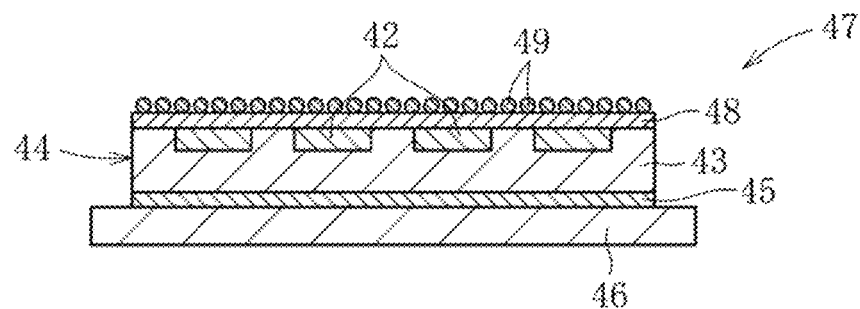
FIG. 5F is a schematic sectional view for illustrating a manufacturing process for a fan-out type WLP.
Figure 5G:
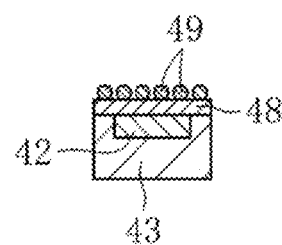
FIG. 5G is a schematic sectional view for illustrating a manufacturing process for a fan-out type WLP.

FIGS. 5A to 5G are schematic sectional views for illustrating a manufacturing process for a fan-out type WLP. FIG. 5A is an illustration of a state in which an adhesive layer 41 is formed on one surface of a supporting member 40. As necessary, a peeling layer may be formed between the supporting member 40 and the adhesive layer 41. Next, as illustrated in FIG. 5B, a plurality of semiconductor chips 42 are bonded onto the adhesive layer 41. In this case, an active surface of each semiconductor chip 42 is brought into contact with the adhesive layer 41. Then, as illustrated in FIG. 5C, the semiconductor chips 42 are molded with a sealing material 43 of a resin. As the sealing material 43, a material having less change in dimension after compression molding and having less change in dimension during formation of wiring is used. Then, as illustrated in FIG. 5D and FIG. 5E, a substrate 44 to be processed having the semiconductor chips 42 molded therein is separated from the supporting member 40 and is adhesively fixed onto a glass sheet 46 through intermediation of an adhesive layer 45. In this case, in the surface of the substrate 44 to be processed, the surface on an opposite side to the surface in which the semiconductor chips 42 are buried is arranged on the glass sheet 46 side. Thus, a laminate 47 can be obtained. As necessary, a peeling layer may be formed between the adhesive layer 45 and the glass sheet 46. After the obtained laminate 47 is conveyed, as illustrated in FIG. 5F a wiring 48 is formed on the surface of the substrate 44 to be processed in which the semiconductor chips 42 are buried, and then a plurality of solder bumps 49 are formed. Finally, after the substrate 44 to be processed is separated from the glass sheet 46, the substrate 44 to be processed is cut for each semiconductor chip 42 to be used in a later packaging step (FIG. 5G).

EXAMPLES

Example 1

Now, the present invention is described with reference to Examples. However, Examples below are merely examples, and the present invention is by no means limited to the following Examples.

Glass raw materials were blended so as to comprise as a glass composition, in terms of mass %, 65.5% of $SiO_2$, 8% of $Al_2O_3$, 9% of $B_2O_3$, 13.1% of $Na_2O$, 3% of CaO, 1% of ZnO, 0.3% of $SnO_2$, and 0.1% of $Sb_2O_3$. After that, the resultant was loaded into a glass melting furnace to be melted at from 1,500° C. to 1,600° C. Then, the molten glass, was supplied into an overflow down-draw forming apparatus to be formed to a thickness of 1.0 mm. Further, the resultant was cut to a predetermined size and subjected to annealing treatment.

Next, the outer periphery of the obtained glass sheet was processed into a perfectly circular shape of σ 300 mm. After that, a semicircular recess, that is, a position alignment portion having a notch shape (depth: 1.1 mm) was formed, and the position alignment portion was subjected to chamfering processing. In the chamfering processing, the chamfer width of the position alignment, portion in the thickness direction, thereof was set to 50% of the thickness thereof, and glass sheets different in chamfer width of the position alignment portion in the surface direction thereof were produced. In addition, a boundary between the position alignment portion and the contour portion of each glass sheet was processed into a continuously rounded state. Polishing pads used in the chamfering processing are made of urethane, and the chamfered surface has a polishing roughness of #800.

Subsequently, the surface of each glass sheet after contour processing was subjected to polishing treatment with a polishing apparatus to reduce the total thickness variation of the glass sheet to less than 1.0 μm. Specifically, both surfaces of the glass sheet were sandwiched between a pair of polishing pads having different outer diameters, and both the surfaces of the glass sheet were subjected to polishing treatment while the glass sheet and the pair of polishing pads were rotated together. Part of the glass sheet was caused to extend off from the polishing pads intermittently during the polishing treatment. The polishing pads were made of urethane. The average particle diameter of a polishing slurry used in the polishing treatment was 2.5 μm, and the polishing speed was 15 m/min.

Finally, for each of the glass sheets different in chamfer width in the surface direction, a four-point bending test was performed 10 times with a precision universal tester Autograph AG-IS manufactured by Shimadzu Corporation. The results are shown in Table 1. The four-point bending test was performed under the conditions of a pressurizing jig width of 25 mm, a supporting jig width of 50 mm, and a crosshead lowering speed of 5 mm/min, and the position alignment portion was placed between pressurizing jigs.

TABLE 1

|  | No. 1 | No. 2 | No. 3 | No. 4 |
|---|---|---|---|---|
| Chamfer width in surface direction (μm) | 500 | 200 | 150 | 0 |
| Fracture strength |  |  |  |  |
| Average (MPa) | 132 | 88 | 79 | <50 |
| Maximum (MPa) | 158 | 152 | 85 | <50 |
| Minimum (MPa) | 112 | 63 | 74 | <50 |

As apparent from Table 1, when the position alignment portion was chamfered, the fracture strength was increased. In addition, when the chamfer width of the position alignment portion in the surface direction thereof was increased, the fracture strength was increased.

Example 2

First, glass raw materials were blended so as to have a glass composition of each of Sample Nos. 1 to 7 shown in Table 2. After that, the resultant was loaded into a glass melting furnace to be melted at from 1,500° C. to 1,600° C. Then, the molten glass was supplied into an overflow down-draw forming apparatus to be formed to a thickness of 0.8 mm. After that, in the same manner as in [Example 1], outer periphery processing was performed, and a position alignment portion having a semicircular recess was formed. Next, the position alignment portion and the contour portion were subjected to chamfering processing. In the chamfering processing, a chamfer width in a thickness direction was set to 50% of a thickness, and a chamfer width in a surface direction was set to 600 µm. In addition, a boundary between the position alignment portion and the contour portion of the glass sheet was processed into a continuously rounded state. Polishing pads used in the chamfering processing are made of urethane, and the chamfered surface has a polishing roughness of #800. Each of the obtained glass sheets was evaluated for an average thermal expansion coefficient within a temperature range of from 30° C. to 380° C., a density ρ, a strain point Ps, an annealing point Ta, a softening point Ts, a temperature at a viscosity at high temperature of $10^{4.0}$ dPa·s, a temperature at a viscosity at high temperature of $10^{3.0}$ dPa·s, a temperature at a viscosity at high temperature of $10^{2.5}$ dPa·s, a temperature at a viscosity at high temperature of $10^{2.0}$ dPa·s, a liquidus temperature TL, and a Young's modulus E. Each of the glass sheets after contour processing was measured for a total thickness variation and a warpage level with SBW-331ML/d manufactured by Kobelco Research Institute, Inc. As a result, each total thickness variation was 3 µm, and each warpage level was 70 µm.

The average thermal expansion coefficient $\alpha_{30\text{-}380}$ within a temperature range of from 30° C. to 380° C. is a value measured with a dilatometer.

The density ρ is a value measured by a well-known Archimedes method.

The strain point Ps, the annealing point Ta, and the softening point Ts are values obtained by measurement based on the method of ASTM C336.

The temperatures at viscosities at high temperature of $10^{4.0}$ dPa·s, $10^{3.0}$ dPa·s, and $10^{2.5}$ dPa·s are values obtained by measurement by a platinum sphere pull up method.

The liquidus temperature TL is a value obtained by loading glass powder that has passed through a standard 30-mesh sieve (500 µm) and remained on a 50-mesh sieve (300 µm) into, a platinum boat, keeping the glass powder for 24 hours in a gradient heating furnace, and then measuring, by a microscopic observation, a temperature at which crystals of glass are deposited.

The Young's modulus E is a value measured toy a resonance method.

Then, the surface of the glass sheet after contour processing was subjected to polishing treatment with a polishing apparatus. Specifically, both surfaces of the glass sheet were sandwiched between a pair of polishing pads having different outer diameters, and both the surfaces of the glass sheet were subjected to polishing treatment, while the glass sheet and the pair of polishing pads were rotated together. Part of the glass sheet was caused to extend off from the polishing pads intermittently during the polishing treatment. The polishing pads were made of urethane. The average particle diameter of a polishing slurry used in the polishing treatment was 2.5 µm, and the polishing speed was 15 m/min. Each of the obtained polished glass sheets was measured for a total thickness variation and a warpage level with SBW-331ML/d manufactured by Kobelco Research Institute, Inc. As a result, each total thickness variation was 0.45 µm, and each warpage level was 35 µm.

Example 3

For each of the position alignment portion and the region except for the position alignment portion (contour portion) of the glass sheet according to Sample No. 2 obtained in [Example 1], the entire end surface including the chamfered surface was subjected to mirror surface polishing treatment, and then the surface of the glass sheet was subjected to polishing treatment with a polishing apparatus by the same method as that of [Example-1]. Polishing pads used in the mirror surface polishing treatment are made of urethane, and the surface subjected to the mirror surface polishing treatment has a polishing roughness of #3000. For comparison, there was also produced a glass sheet in which the entire end surface including the chamfered surface was subjected to polishing treatment with #1500 polishing pads.

Subsequently, for each of the obtained glass sheets, the surface roughness of the end surface including the chamfered surface was measured by a method in accordance with JIS B0601:2001, and a four-point bending test was per-

TABLE 2

| | | No. 1 | No. 2 | No. 3 | No. 4 | No. 5 | No. 6 | No. 7 |
|---|---|---|---|---|---|---|---|---|
| Component (wt %) | $SiO_2$ | 65.0 | 63.2 | 65.3 | 64.0 | 60.0 | 58.4 | 61.4 |
| | $Al_2O_3$ | 8.2 | 8.0 | 8.0 | 8.0 | 16.7 | 13.0 | 18.0 |
| | $B_2O_3$ | 13.5 | 13.1 | 8.6 | 13.3 | 9.8 | 0.0 | 0.5 |
| | MgO | 0.0 | 0.0 | 0.0 | 0.0 | 0.8 | 2.0 | 3.0 |
| | CaO | 3.3 | 3.2 | 3.2 | 3.2 | 8.0 | 2.0 | 0.0 |
| | SrO | 0.0 | 0.0 | 0.0 | 0.0 | 4.5 | 0.0 | 0.0 |
| | ZnO | 0.9 | 0.9 | 0.9 | 1.0 | 0.0 | 0.0 | 0.0 |
| | $Na_2O$ | 8.7 | 11.3 | 13.6 | 10.1 | 0.0 | 14.5 | 14.5 |
| | $K_2O$ | 0.0 | 0.0 | 0.0 | 0.0 | 0.0 | 5.5 | 2.0 |
| | $ZrO_2$ | 0.0 | 0.0 | 0.0 | 0.0 | 0.0 | 4.5 | 0.0 |
| | $Sb_2O_3$ | 0.1 | 0.0 | 0.1 | 0.1 | 0.0 | 0.0 | 0.0 |
| | $SnO_2$ | 0.3 | 0.3 | 0.3 | 0.3 | 0.2 | 0.0 | 0.7 |
| $\alpha_{30\text{-}380}$ ($\times 10^{-7}$/° C.) | | 59 | 68 | 77 | 64 | 38 | 102 | 91 |
| ρ (g/cm³) | | 2.39 | 2.43 | 2.47 | 2.41 | 2.46 | 2.54 | 2.45 |
| Ps (° C.) | | 535 | 530 | 530 | 530 | 673 | 533 | 564 |
| Ta (° C.) | | 570 | 565 | 565 | 565 | 725 | 576 | 613 |
| Ts (° C.) | | 755 | 730 | 735 | 740 | 943 | 793 | 863 |
| $10^{4.0}$ dPa·s (° C.) | | 1,095 | 1,050 | 1,045 | 1,065 | 1,256 | 1,142 | 1,255 |
| $10^{3.0}$ dPa·s (° C.) | | 1,305 | 1,240 | 1,240 | 1,265 | Unmeasured | 1,319 | 1,460 |
| $10^{2.5}$ dPa·s (° C.) | | 1,450 | 1,385 | 1,380 | 1,410 | 1,519 | 1,431 | 1,591 |
| $10^{2.0}$ dPa·s (° C.) | | 1,640 | 1,570 | 1,540 | 1,595 | Unmeasured | Unmeasured | Unmeasured |
| TL (° C.) | | 890 | 802 | 800 | 850 | Unmeasured | 880 | 970 |
| E (GPa) | | 71 | 74 | 75 | 75 | 75 | 75 | 71 | formed 10 times with a precision universal tester Autograph AG-IS manufactured by Shimadzu Corporation. The results are shown in Table 3. The four-point bending test was performed under the conditions of a pressurizing jig width of 25 mm, a supporting jig width of 50 mm, and a crosshead lowering speed of 5 mm/min, and the position alignment portion was placed between pressurizing jigs.

TABLE 3

|  |  | No. 2 (#3000 polishing) | No. 2 (#800 polishing) |
|---|---|---|---|
| Average surface roughness Ra (μm) | Position alignment portion | 0.04 | 0.10 |
|  | Contour portion | 0.03 | 0.12 |
| Maximum surface roughness Rz (μm) | Position alignment portion | 0.06 | 0.13 |
|  | Contour portion | 0.04 | 0.17 |
| Fracture strength Four-point bending strength (MPa) | Average | 186 | 160 |
|  | Maximum | 219 | 218 |
|  | Minimum | 141 | 96 |

As apparent from Table 3, when the entire end surface including the chamfered surface was subjected to mirror surface polishing treatment, the fracture strength in the four-point bending test was improved.

REFERENCE SIGNS LIST 1, 5, 9, 20, 36, 46 glass sheet
2, 6, 10, 38 position alignment portion
3, 7, 11, 40 contour portion
4, 8 deep portion of notch shape
21, 22 surface
23 end surface
24, 25 chamfered surface
31, 47 laminate
32, 33, 34 positioning member
35, 44 substrate to be processed
37 position alignment portion of substrate to be processed
39 contour portion of substrate to be processed
40 supporting member
41, 45 adhesive layer
42 semiconductor chip
43 sealing material
48 wiring
49 solder bump

The invention claimed is:
1. A glass sheet, comprising, in a contour thereof:
a contour portion;
a surface having a front surface and a rear surface opposed to each other in a thickness direction of the glass sheet; and
a position alignment portion,
wherein each of the front surface and the rear surface of the surface has an average surface roughness Ra of 10 nm or less,
wherein all or part of an end edge region of the position alignment portion where a surface of the position alignment portion and an end surface of the position alignment portion intersect is chamfered, and
wherein the position alignment portion has a chamfer width in a thickness direction thereof of from 5% to 80% of a thickness thereof.
2. The glass sheet according to claim 1, wherein the position alignment portion has a chamfer width in a surface direction thereof of from 50 um to 900 um.
3. The glass sheet according to claim 1,
wherein the glass sheet has a chamfered surface in the end edge region of the position alignment portion where the surface of the position alignment portion and the end surface of the position alignment portion intersect, and
wherein the chamfered surface has an average surface roughness Ra of 0.20 μm or less.
4. The glass sheet according to claim 1,
wherein the glass sheet has a chamfered surface in the end edge region of the position alignment portion where the surface of the position alignment portion and the end surface of the position alignment portion intersect, and
wherein the chamfered surface and the end surface are connected to each other in a continuously rounded state.
5. The glass sheet according to claim 1, wherein the position alignment portion has a notch shape.
6. The glass sheet according to claim 1,
wherein all or part of the contour portion is chamfered, and
wherein the contour portion has a chamfer width in a surface direction thereof of from 50 μm to 900 μm.
7. The glass sheet according to claim 1, wherein the contour has a wafer shape.
8. The glass sheet according to claim 1, wherein the glass sheet has a total thickness variation of less than 2.0 μm.
9. The glass sheet according to claim 1, wherein the glass sheet is formed by an overflow down-draw method.
10. The glass sheet according to claim 1, wherein the glass sheet is used for supporting a substrate to be processed in a manufacturing process for a semiconductor package.
11. A laminate, comprising at least a substrate to be processed and a glass sheet configured to support the substrate to be processed, the glass sheet comprising the glass sheet of claim 1.
12. A method of manufacturing a semiconductor package, comprising the steps of:
preparing a laminate including at least a substrate to be processed and a glass sheet configured to support the substrate to be processed; and
subjecting the substrate to be processed to processing treatment,
the glass sheet comprising the glass sheet of claim 1.
13. The method of manufacturing a semiconductor package according to claim 12, wherein the processing treatment comprises a step of arranging wiring on one surface of the substrate to be processed.
14. The method of manufacturing a semiconductor package according to claim 12, wherein the processing treatment comprises a step of forming a solder bump on one surface of the substrate to be processed.

* * * * *